(12) United States Patent
Kim

(10) Patent No.: US 6,172,932 B1
(45) Date of Patent: Jan. 9, 2001

(54) ON-CHIP VOLTAGE GENERATING DEVICE FOR SEMICONDUCTOR MEMORY WITH REDUCED STAND-BY CURRENT

(75) Inventor: Yong Ki Kim, Kyoungki-do (KR)

(73) Assignee: Hyundai Electronics Industries Co., Ltd., Kyoungki-do (KR)

(*) Notice: Under 35 U.S.C. 154(b), the term of this patent shall be extended for 0 days.

(21) Appl. No.: 09/343,560

(22) Filed: Jun. 30, 1999

(30) Foreign Application Priority Data

Jul. 21, 1998 (KR) .................................................. 98-29302

(51) Int. Cl.[7] ...................................................... G11C 7/00
(52) U.S. Cl. ........................ 365/227; 365/222; 365/226; 365/233
(58) Field of Search ..................................... 365/227, 222, 365/226, 233, 189.09, 189.11, 189.01, 230.01

(56) References Cited

U.S. PATENT DOCUMENTS

| | | |
|---|---|---|
| 5,297,097 | 3/1994 | Etoh et al. ............................ 365/226 |
| 5,365,487 | 11/1994 | Patel et al. ........................... 365/226 |
| 5,453,959 | 9/1995 | Sakuta et al. ........................ 365/222 |
| 5,528,538 * | 6/1996 | Sakuta et al. .................... 365/189.09 |
| 5,532,968 | 7/1996 | Lee ...................................... 365/222 |
| 5,563,837 | 10/1996 | Noguchi ............................... 365/222 |
| 5,668,762 * | 9/1997 | Suwa ............................... 365/189.11 |
| 5,687,128 | 11/1997 | Lee et al. ............................. 365/226 |
| 5,691,661 | 11/1997 | Fukuda et al. ....................... 327/172 |
| 5,867,442 | 2/1999 | Kim et al. ............................ 365/226 |
| 5,889,719 | 3/1999 | Yoo et al. ............................ 365/226 |

* cited by examiner

*Primary Examiner*—David Nelms
*Assistant Examiner*—Hoai V. Ho
(74) *Attorney, Agent, or Firm*—Nath & Associates; Gary M. Nath; Harold L. Novick

(57) ABSTRACT

An on-chip voltage generating device for semiconductor memory which generates a higher voltage than a power supply voltage or a lower voltage than a ground voltage is provided. The on-chip voltage generating device comprises an on-chip voltage generater for outputting the on-chip voltage by a pumping operation, an on-chip voltage detector for receiving the on-chip voltage, the on-chip voltage detector detecting the voltage level of the on-chip voltage and controlling the operation of the on-chip voltage generater; and an oscillator for controlling an operation of the on-chip voltage detector.

5 Claims, 12 Drawing Sheets

ON-CHIP VOLTAGE GENERATING DEVICE FOR SEMICONDUCTOR MEMORY WITH REDUCED STAND-BY CURRENT

BACKGROUND OF THE INVENTION

1. Field of the Invention

The present invention relates to an on-chip voltage generating device for semiconductor memory, and more particularly to an on-chip voltage generating device with reduced stand-by current during a self-refreshing mode period.

2. Description of the Prior Art

Generally, a semiconductor memory device includes a memory cell array of a two-dimensional matrix form with a rectangular type, a pheriperal circuit which enables the reading/writing operation from/to the memory cell array by the control of a plurality of external control signals and address signals, and data terminals through which data are input or output.

A dynamic memory device comprises a plurality of memory cells and an amount of charge stored on a capacitor of each memory cell is reduced due to a leakage with the lapse of time. For this reason, a refresh operation is periodically performed to recover the leakage charge amount on the capacitor.

As the refreshing operations, there are the RAS only refreshing mode with employment of the row-address strobe signal "RAS", the CBR refreshing mode in which the column-address strobe signal "CAS" is set to a low level in advance before the row-address strobe signal "RAS" is set to a low level, and self-refreshing mode which determines by itself a refresh time and refresh addresses in response to a specific command and performs a refresh operation.

An object of the present invention is to provide a device which can reduce power consumption during a self-refresh period. The method or timing of the entry to the self-refresh mode is shown in FIG. 11 and FIG. 12 in the timing diagram. As shown in the diagram, the self-refresh operation is performed by the control signals. Wherein FIG. 11 indicates a self refresh operation in a Synchronous DRAM, and FIG. 12 indicates a self refresh operation in a DRAM. The self-refresh signals shown in FIG. 11 and FIG. 12 will be used in the on-chip voltage generating device of the present invention, and the function of them will be explained hereinafter.

In general, a DRAM comprises a memory cell array, a pheriperal circuit which controls row paths and column paths to access effective locations of the memory cell array, and an on-chip voltage generating circuit for supplying predetermined voltages to the memory cell array and the pheriperal circuit.

One of the important factors to reduce the current consumption is to control the operation of the on-chip voltage generating circuit. When the memory device enters a self refresh mode, only absolutely necessary external signals are enabled, but other signals remain in a turned-off state. Therefore, in this case, most of the current is consumed in the operation of the on-chip voltage generating devices, such as a low voltage generating device and a high voltage generating device.

Semiconductor memory generally includes a low voltage generating device which is used for the bulk bias voltage of the memory cell array and a high voltage generating device which is used for activating the word lines. The operation of these voltage generating devices may vary according to the operation mode of the memory device.

These voltage generating devices generally have two modes of operations.

One mode is a stand-by mode which indicates an inactive state when memory cell transistors and sense amplifiers are not activated.

Another mode is an active mode which indicates an active state when memory cell transistors and sense amplifiers are activated. This active state means that for example the data stored in the memory cell is delivered to the bit lines and the data are amplified by the sense amplifiers.

A large current is generally consumed when performing the active mode operation, thus more noise is caused in comparison to the operation in the stand-by mode. Accordingly, in consideration of this problem, power is generally sufficiently supplied to the conventional on-chip voltage generating device to perform a stable operation. This conventional on-chip voltage generating device operates in stand-by mode and active mode as shown in FIG. 1.

In the diagram, the high voltage generating device comprises, a high voltage detector 1 and a high voltage generator 2 which operate in stand-by mode; and a high voltage detector 3 and a high voltage generator 4 which operate in active mode.

As illustrated above, the stand-by mode and the active mode are repeated during a self refresh operation.

The high voltage generating device, as shown in FIG. 1, comprises the high voltage generator 2 (i.e., small pumping circuit) for stand-by and the high voltage generator 4 (i.e., large pumping circuit) for active mode. Each of them has a corresponding voltage detector in order to determine the timing of a pumping operation by detecting the level of the high voltage.

The circuit construction of the high voltage detectors 1 and 2 shown in FIG. 1 is indicated in detail in FIG. 2 and FIG. 3.

In FIG. 2, the high voltage detector operating in stand-by mode comprises current mirror circuit and inverter means. During operation, in a case when a high voltage is decreased, the /PPEST is changed to a low level. Accordingly, the high voltage generator 2 shown in FIG. 1 is operated.

Next, the operation of the high voltage detector for active mode with reference to FIG. 3 will be illustrated. In the diagram, VPP indicates a high voltage higher than the power source voltage Vcc, and is the output voltage from the high voltage pumping device shown in FIGS. 4 and 5. The high voltage VPP is applied to the resistor R1 and supplies current to the transistor MN1. The current amount in the transistor MN2 may be similar to the current in the transistor MN1 by the current mirror phenomenon. Therefore, when the voltage level of the high voltage VPP is increased, the current amount in the transistor MN2 also proportionately increases. Accordingly, the voltage level of the node between the transistor MN2 and the resistor R2 is determined by the current amount which flows through the resistor R2. At this time, the voltage level of the signal "rasact" is maintained at a high level to enable the voltage detector. Accordingly, when the voltage VPP is increased, the current amount flowing through the transistors MN1 and MN2 also increases. Therefore, the signal /PPEAT is changed to a high level and is applied to the oscillator. As a result, the pumping operation may be stopped and the voltage VPP will no longer increase. If the voltage VPP is decreased, a reverse operation is conducted. Therefore, the pumping operation is activated to raise the voltage level of VPP.

As illustrated above, a current amount is used in the operation of the high voltage detector. In particular, the high voltage detector operating in stand-by mode always consumes a certain amount of current because it does not comprise a switching circuit which can control the turn on/off operation by itself. Therefore, the consumed current within the high voltage detector is considerable, so that power consumption eventually increase.

In particular, such a considerably consumed current causes negative effects in a self-refresh operation mode where a current consumption should be restricted.

In general, in an active mode during a self-refreshing operation, the effect of the amount of the operating current of the high voltage detector is not significant because the operating current of the sense amplifiers is considerable. However, in a stand-by mode during a self-refreshing operation, the effect of the amount of the operating current of the high voltage detector is significant on the power consumption of the memory device. Therefore, it is required to resolve such a problem by reducing or eliminating this unnecessary current consumption. Such a problem may also occur in a low voltage VBB generating device which generates a voltage VBB, such as a bulk bias voltage of the transistors which constitute cell transistors of the memory device. The function of the VBB is to control the threshold voltage of the transistor and to reduce the capacitance of the bit lines. The current consumed in the low voltage VBB generating device also has a similar problem in the high voltage generating device.

Therefore, the present invention has been made in view of the above problems, and it is an object of the present invention to provide a voltage generating means which reduces the operating current and discriminates between the operating modes of the voltage detector, stand-by mode with both turn-on mode and turn-off mode, so as to reduce the current consumption.

SUMMARY OF THE INVENTION

Accordingly, the present invention for accomplishing the above object is directed to an on-chip voltage generating device for a semiconductor memory comprising: oscillating means for outputting a clock pulse of a certain frequency, the oscillating means reciving a self refresh signal; on-chip voltage detecting means for detecting a level of the on-chip voltage, the on-chip voltage detecting means being controlled by the clock pulse from the oscillator; and on-chip voltage generating means for outputting the on-chip voltage in response to the output signal from the on-chip voltage detecting means; wherein the on-chip voltage detecting means receives the on-chip voltage, performs a normal operation outputting the on-chip voltage while the self refresh signal is disabled, and is turned on/off periodically in response to the clock pulse when the semiconductor memory is entered into a stand-by mode by enabling the self refresh signal.

According to the present invention, the on-chip voltage may be a high voltage which is applied to the word lines of the semiconductor memory, and the high voltage is higher than a power supply voltage.

According to the present invention, the on-chip voltage may be a low voltage which is applied to the bulk of the semiconductor memory, and the low voltage is lower than a ground voltage.

According to another aspect of the present invention, an on-chip voltage generating device for a semiconductor memory comprises, oscillating means for outputting a clock pulse of a certain frequency, the oscillating means reciving a control signal; on-chip voltage detecting means for detecting a level of the on-chip voltage, the on-chip voltage detecting means being controlled by the clock pulse from the oscillator; and on-chip voltage generating means for outputting the on-chip voltage in response to the output signal from the on-chip voltage detecting means; wherein the on-chip voltage detecting means receives the on-chip voltage, performs a normal operation outputting the on-chip voltage while the control signal is disabled, and is turned on/off periodically in response to the clock pulse when the semiconductor memory is entered into a stand-by mode by enabling the control signal. The control signal of another aspect of the invention is a self refresh signal of the semiconductor memory.

BRIEF DESCRIPTION OF THE ATTACHED DRAWINGS

The accompanying drawings, which are included to provide further understanding of the invention and are incorporated in and constitute a part of this specification, illustrate embodiments of the invention and together with the description serve to explain the principles of the drawings:

DETAILED DESCRIPTION OF THE PREFERRED EMBODIMENTS

Figure 6:
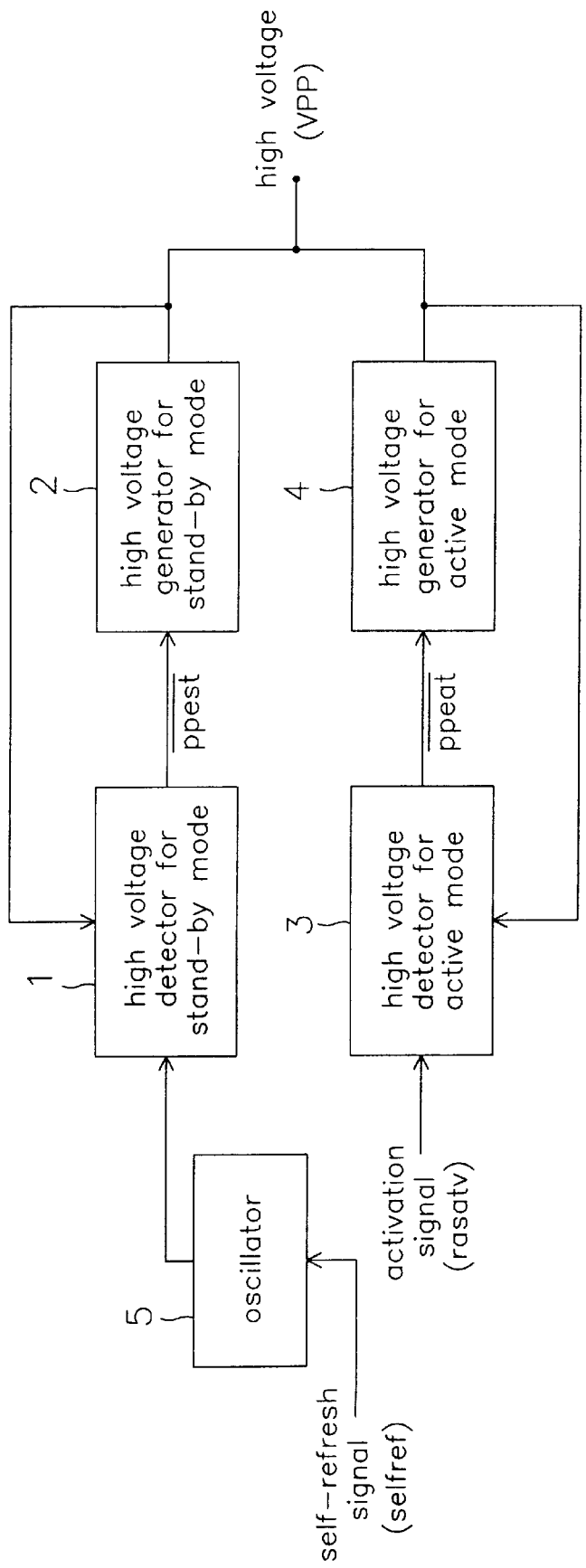
FIG. 6 is a block diagram of a high voltage generating device according to the present invention.

FIG. 6 is a block diagram of an on-chip voltage generating device generating a higher voltage than a power supply voltage in accordance with the present invention. The on-chip voltage generating device generating a higher voltage will be hereinafter designated a high voltage generating device for convenience of explanation.

As shown in the diagram, the high voltage generating device comprises an oscillating means 5 for outputting a clock pulse of a certain frequency, the oscillating means receiving a self refresh signal; an high voltage detecting means 1 for detecting a level of the high voltage, the high voltage detecting means being controlled by the clock pulse from the oscillator; and an high voltage generating means 2 for outputting the high voltage in response to the output signal from the high voltage detecting means.

The high voltage generating device further comprises a high voltage detecting means 3 which receives a memory activating signal "rasatv", and a high voltage generating means 4 which receives a output signal from the high voltage detecting means 3 and outputs the high voltage. It will be omitted the explanation of the operation of the high voltage detecting means 3 and the high voltage generating means 4, because the operations of them are identical with those of prior art.

For refernce, the high voltage detecting means 1 and the high voltage generating means 2 are used in a stand-by mode, and the high voltage detecting means 3 and the high voltage generating means 4 are used in an active mode.

In operation, the high voltage detecting means 1 receives the high voltage VPP, performs a normal operation outputting the high voltage while the self refresh signal is disabled, and is turned on/off periodically in response to the clock pulse when the semiconductor memory is entered into a stand-by mode.

Figure 11:
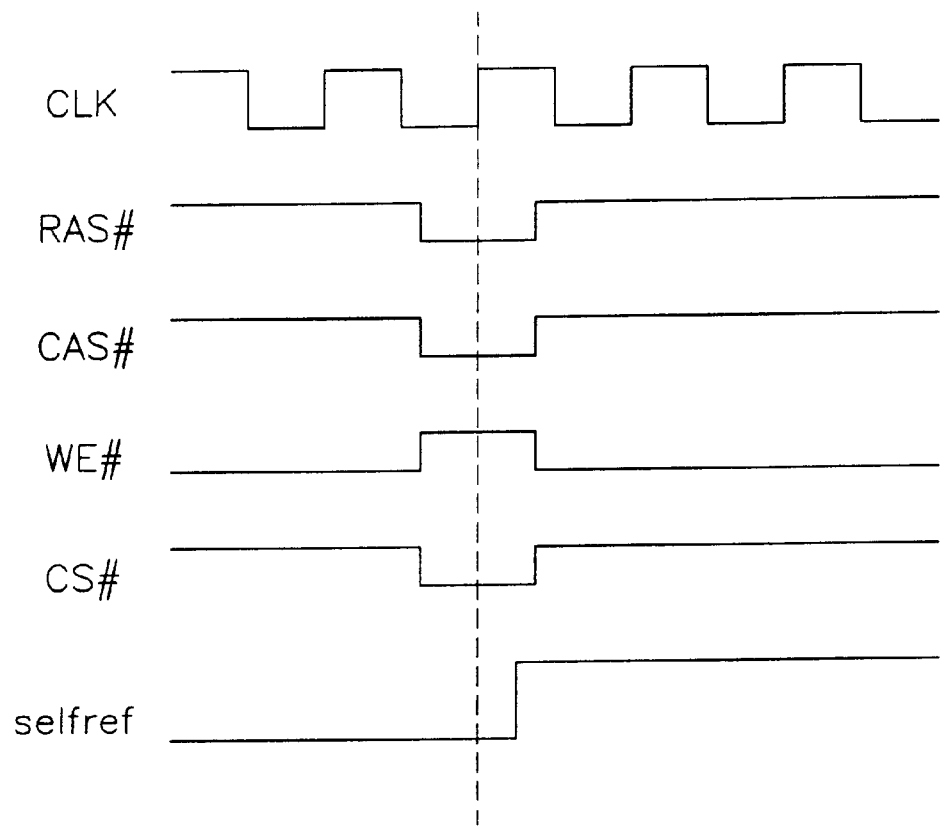
FIG. 11 is a waveform diagram which shows a refresh operation in an SDRAM.
Figure 12:
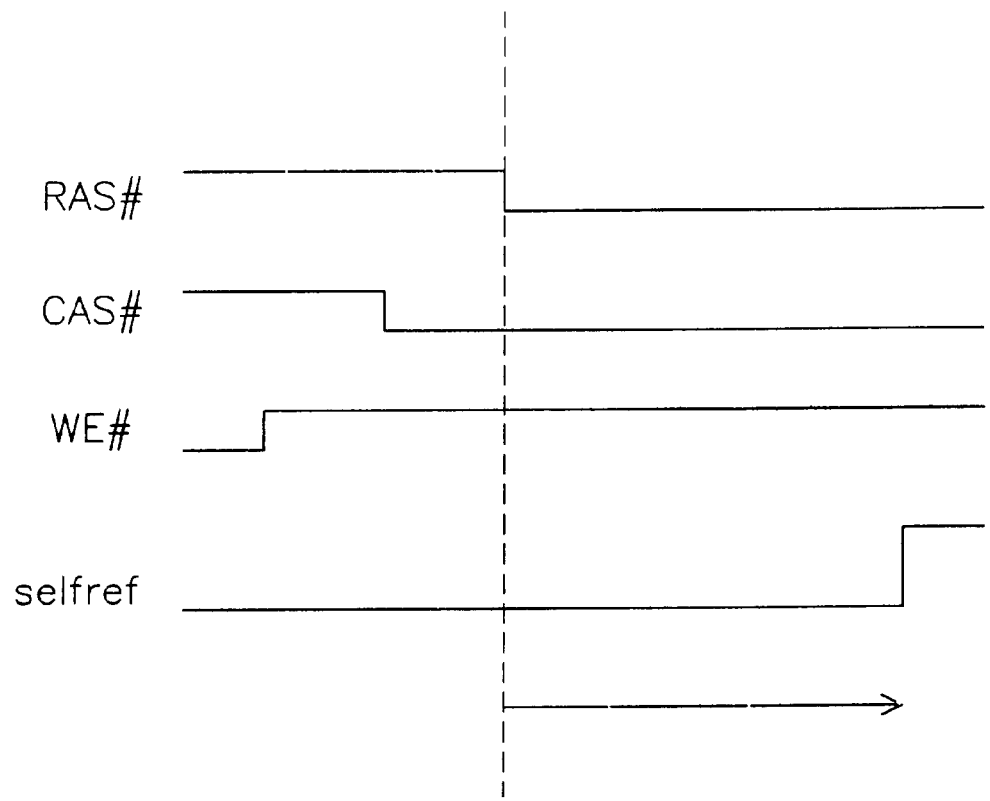
FIG. 12 is a waveform diagram which shows a refresh operation in a DRAM.

A signal "selfref" which indicates a self-refresh mode is applied to the oscillator 5. This signal is shown in FIG. 11 and FIG. 12. In general, the self refresh signal in an SDRAM is disabled when a high voltage is suppied to a CKE pin, and the self refresh signal in an EDO DRAM is disabled in response to a ras precharge operation.

Figure 7:
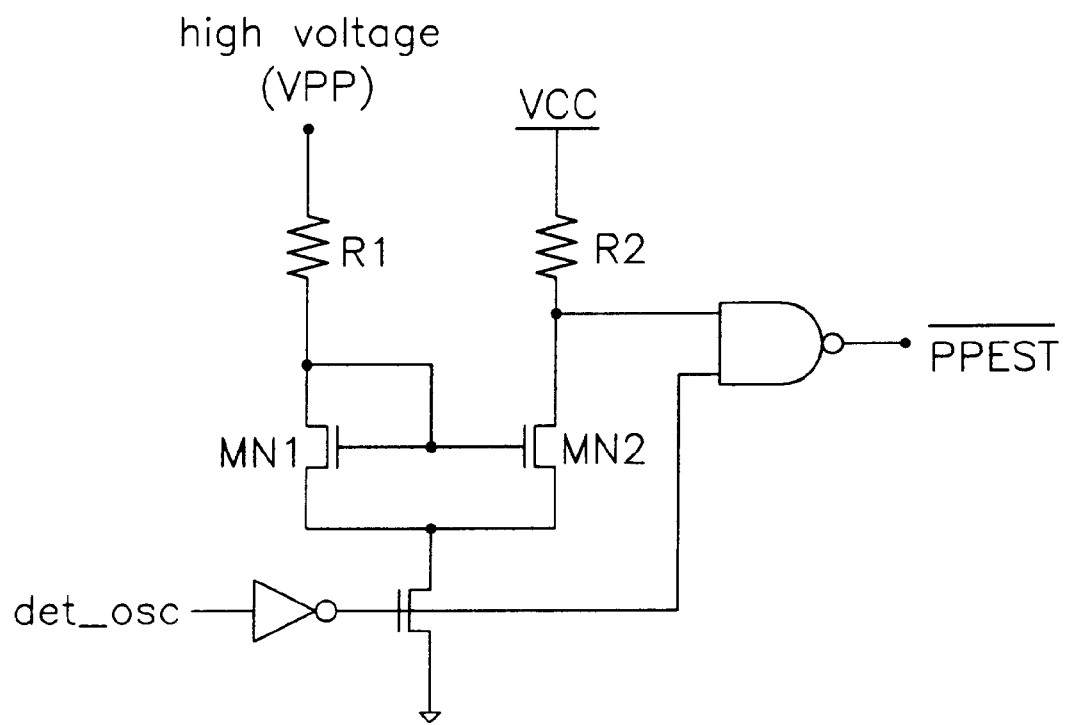
FIG. 7 is a high voltage detector for a stand-by mode operation in FIG. 6.

FIG. 7 is a detailed circuit of a high voltage detector shown in FIG. 6.

As shown in the diagram, the high voltage detector is a current mirror circuit which is controlled by the output signal "det_osc" from the oscillator.

Figure 8A:
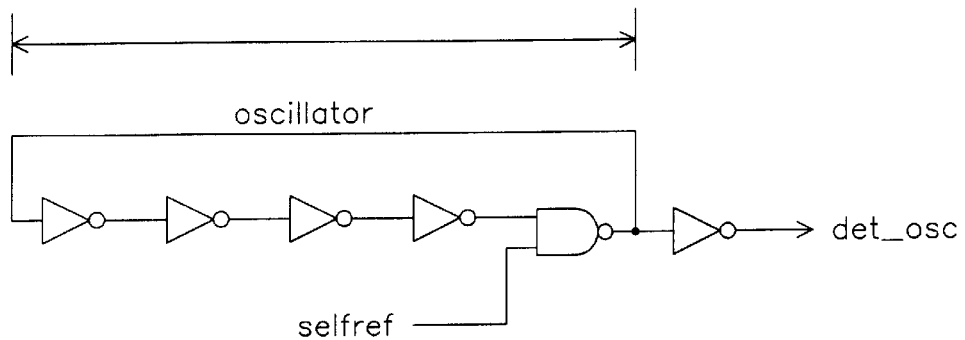
FIG. 8A is a oscillator in FIG. 6.

FIG. 8A shows a detailed circuit of the oscillator 5 shown in FIG. 6.

As shown in the diagram, the oscillator 5 comprises 2N (N is natural number) inverters connected in series, a NAND gate receiving both the output signal from the 2N-th inverter and the signal "selfref", and another inverter (2N+1-th inverter) receiving the output signal from the NAND gate. As illustrated above, the signal "selfref" is a self-refresh signal of the memory device.

The output signal from the NAND gate is also applied to the input terminal of the first inverter of the inverter chains, and the output signal "det_osc" from the 2N+1 inverter controls the operation of the high voltage deteter shown in FIG. 6.

Figure 8B:
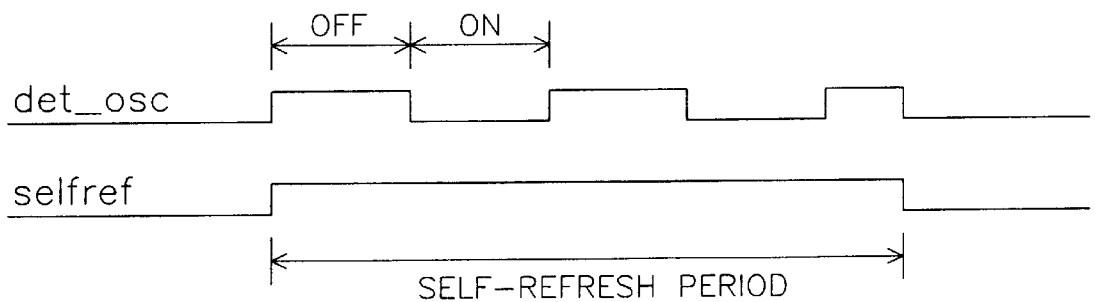
FIG. 8B is a waveform diagram which shows a self-refresh signal selfref applied to the oscillator and the output signal from the oscillator.

FIG. 8B shows waveforms of the self-refresh signal "selfref" applied to the oscillator, and the output signal "det_osc" outputted from the oscillator.

In FIGS. 8A and 8B, when the the level of self refresh signal "selfref" is disabled with a low level (in other words, this memory device is in an active mode), the output signal from the oscillator is low level. Thus, the high voltage generating means performs a normal operation which outputs a high voltage VPP. Therefore, the high voltage generating means shown in FIG. 6 generates normally a high voltage.

Figure 1:
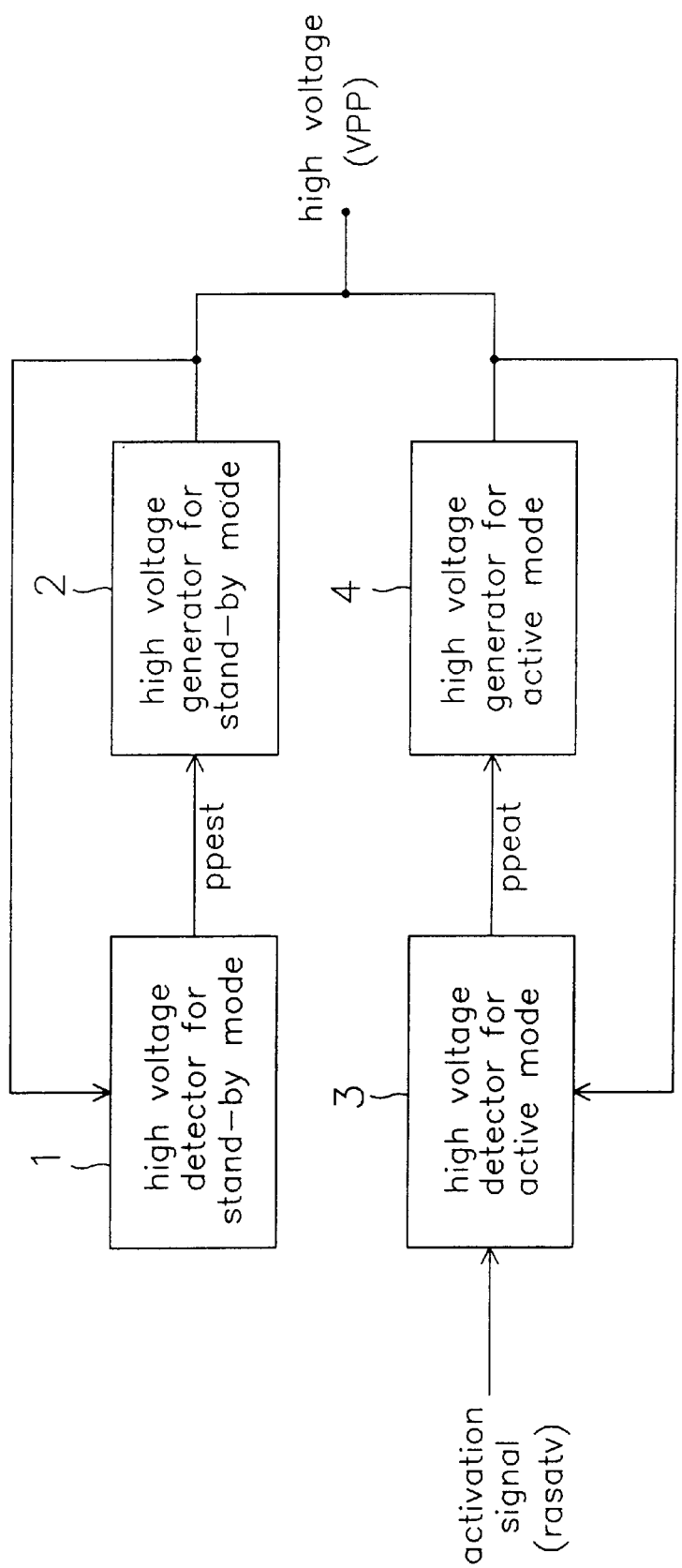
FIG. 1 is a block diagram of a conventional high voltage generating device.
Figure 2:
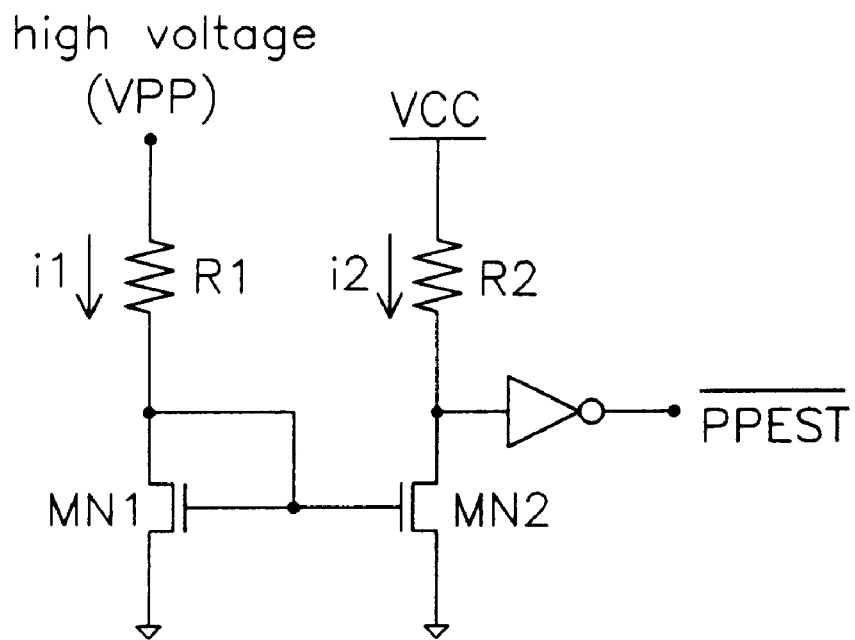
FIG. 2 is a conventional high voltage detector for a stand-by mode operation in FIG. 1.
Figure 3:
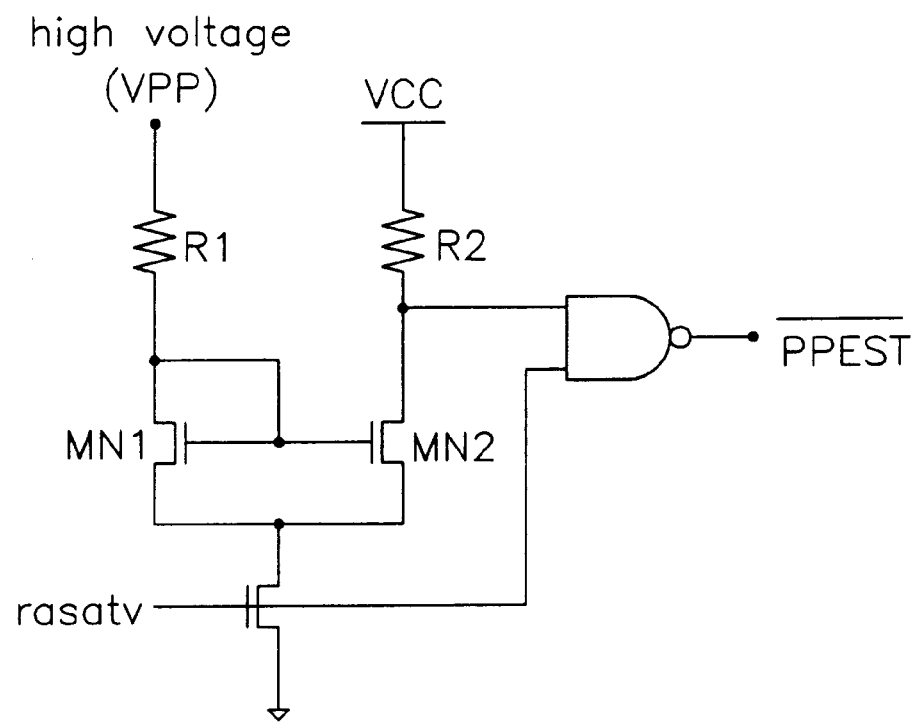
FIG. 3 is a conventional high voltage detector for an activated mode operation in FIG. 1.
Figure 4:
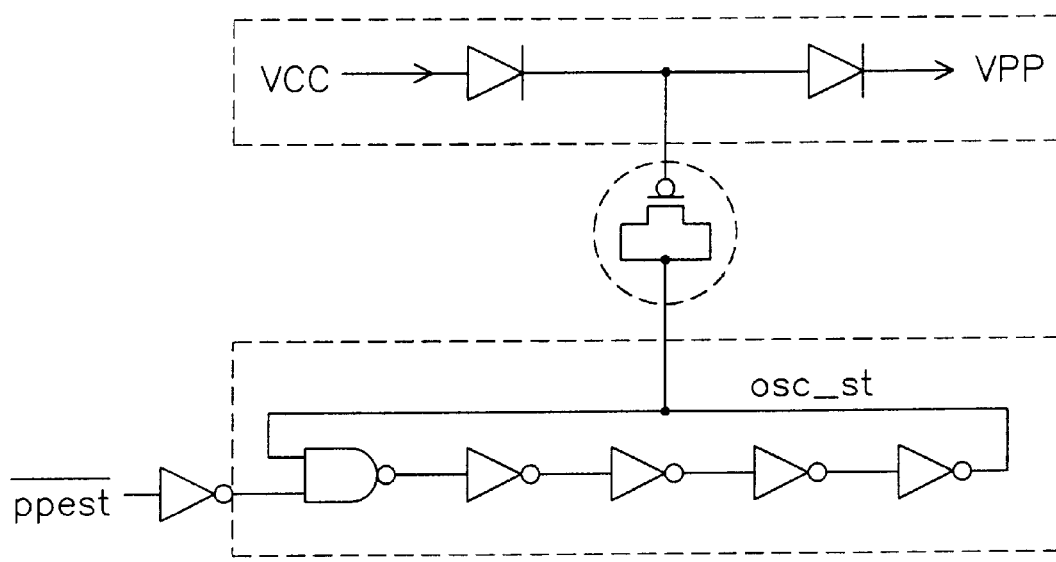
FIG. 4 is a conventional high voltage pumping device for a stand-by mode operation in FIG. 1.
Figure 5:
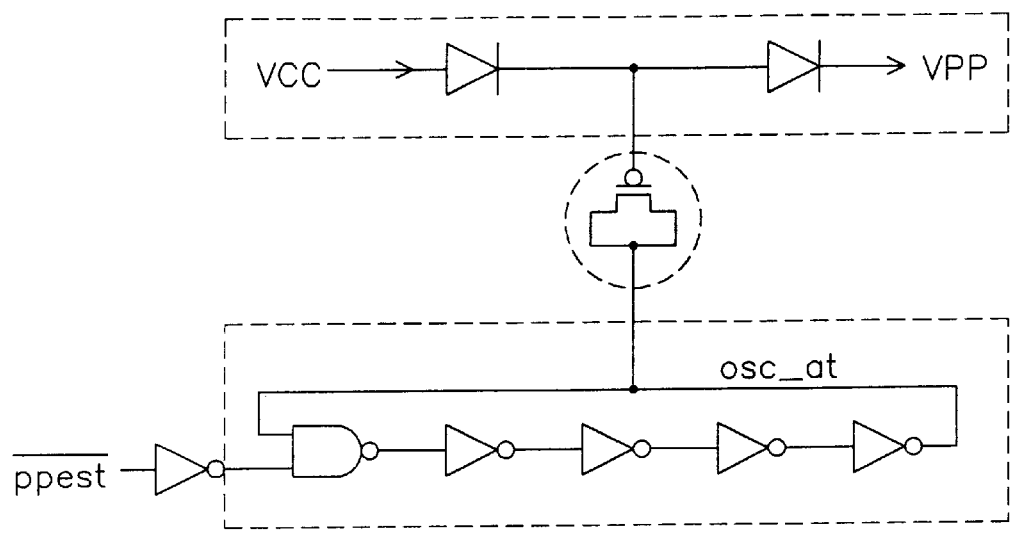
FIG. 5 is a conventional high voltage pumping device for a activated mode operation in FIG. 1.

However, when the level of the self refresh signal "selfref" is enabled with a high level, the oscillating means shown in FIG. 8A generates a clock pulse shown in FIG. 8B. The clock pulse is continuously generated while the self refresh signal is enabled. When the voltage level of the clock pulse is low (i.e., on cycle), the high voltage detecting means is enabled and thus the high voltage generating means outputs the high voltage. However, When the voltage level of the clock pulse is high (i.e., off cycle), the high voltage detecting means is disabled and thus the high voltage generating means shown in FIG. 4 stops the pumping operation.

As described above, if the self refresh signal is enabled, the operation of the high voltage detecting means is periodically turned on or off. Therefore, the current consumption in the high voltage detecting means is stopped while the high voltage detecting means is periodically turned off. In other words, in the turned off period, the current consumption of the high voltage detector is prevented.

Figure 9:
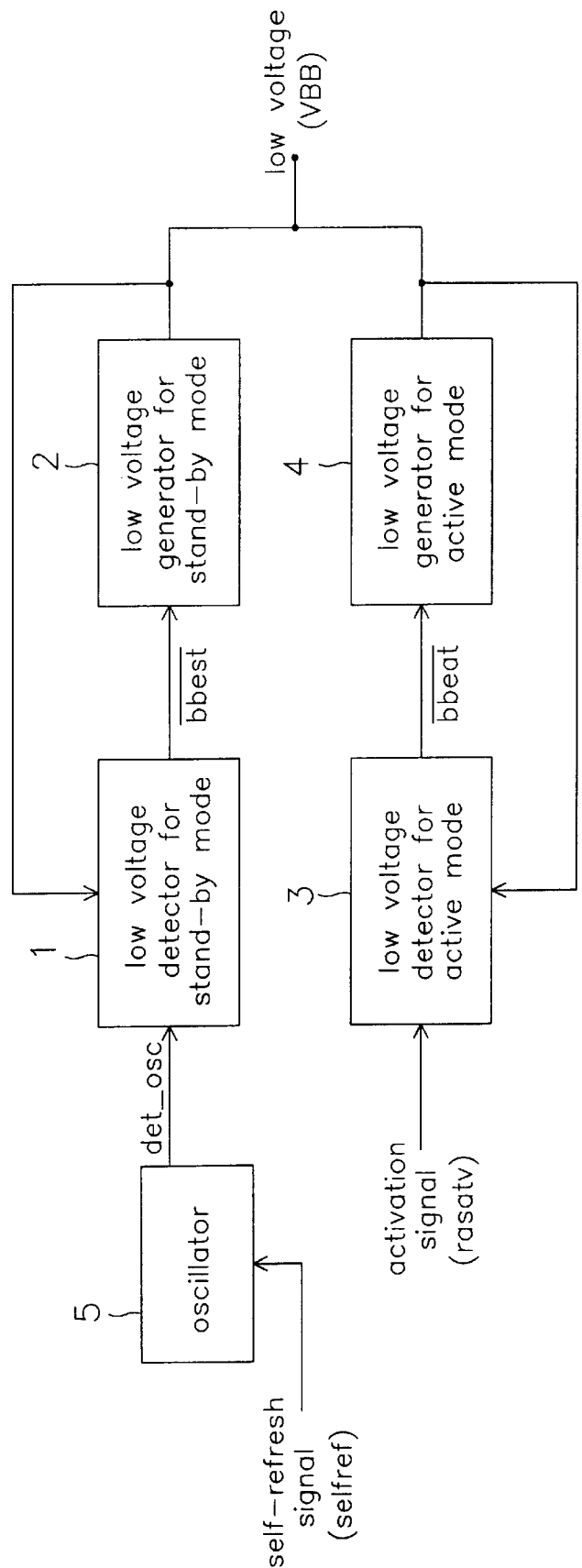
FIG. 9 is a block diagram of a low voltage generating device according to the present invention.

FIG. 9 is a block diagram of another on-chip voltage generating device generating a lower voltage than a ground voltage in accordance with the present invention. This on-chip voltage generating device generating a lower voltage will be hereinafter designated a low voltage generating device for convenience of explanation. The operation of the low voltage generating device shown in FIG. 9 is substantially identiacl with that of the high voltage generating device shown in FIG. 6 except that the low voltage generating device outputs a low voltage.

As shown in the diagram, the low voltage generating device comprises an oscillating means 5 for outputting a clock pulse of a certain frequency, the oscillating means receiving a self refresh signal; a low voltage detecting means 1 for detecting a level of the low voltage, the low voltage detecting means being controlled by the clock pulse from the oscillator; and a low voltage generating means 2 for outputting the low voltage in response to the output signal from the low voltage detecting means.

The high voltage generating device further comprises a low voltage detecting means 3 which receives a memory activating signal "rasatv", and a low voltage generating means 4 which receives a output signal from the low voltage detecting means 3 and outputs the low voltage.

For refernce, the low voltage detecting means 1 and the low voltage generating means 2 are used in a stand-by mode, and the low voltage detecting means 3 and the low voltage generating means 4 are used in an active mode.

The construction of the oscillating means embodied in the low voltage generating device is substantially identical to the one used in the high voltage generating device.

Figure 10:
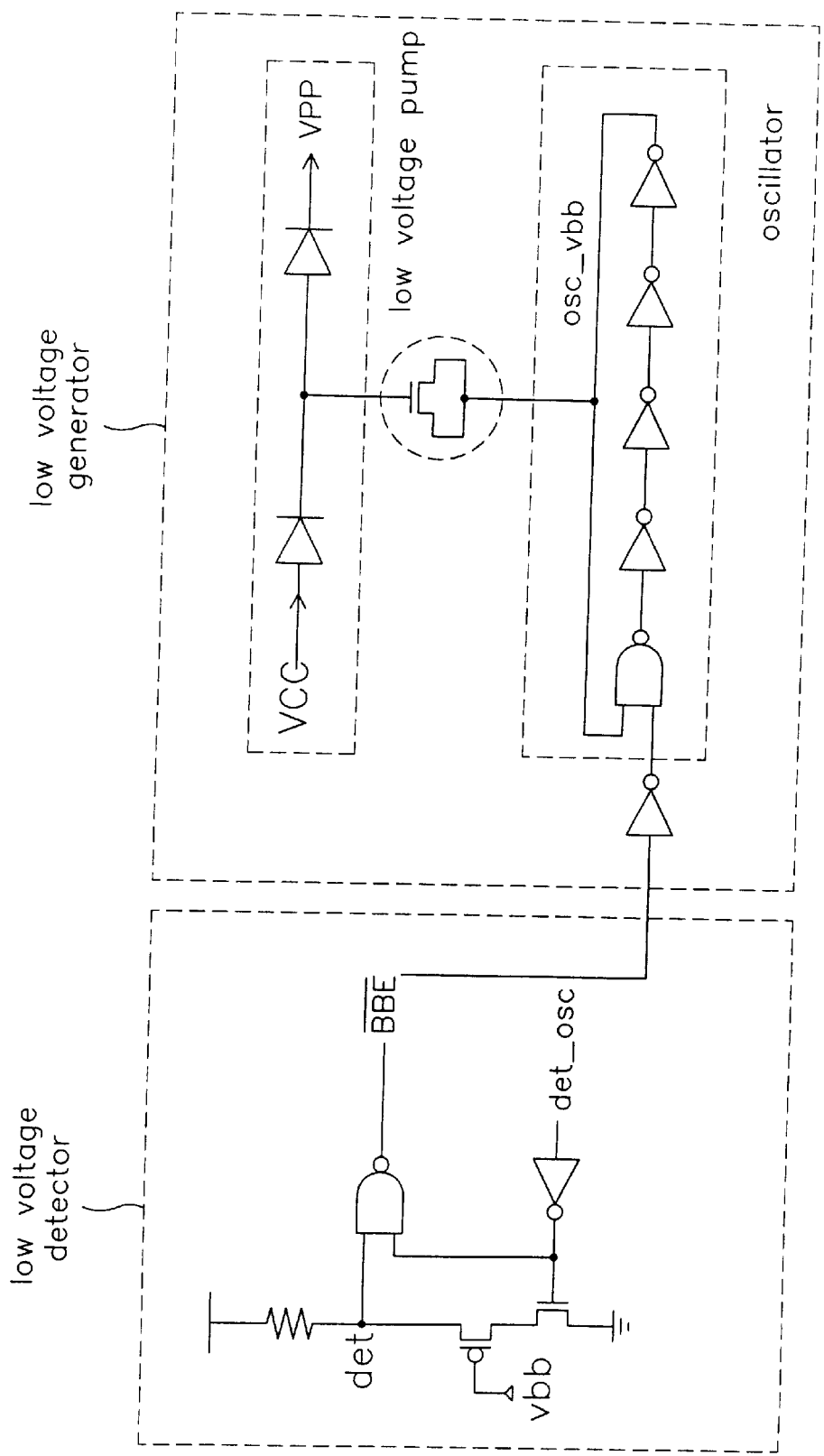
FIG. 10 is a detailed circuit of a low voltage detector and a low voltage generator according to the present invention.

FIG. 10 shows a low voltage detecting means which receives a output signal det_osc from a oscillating means shown in FIG. 9, and a low voltage generating means which receives the output signal from the low voltage detecting means and outputs a low voltage VBB (generally, VBB indicates a Bulk Bias Voltage in memory device).

In operation, if a preferred low voltage VBB is not attained, the current I decreases and the voltage at node det is transitted to a high level and then the output voltage /BEE from the NAND gate changes to a low level. Accordingly, a desirable low voltage is achieved.

As similiar to the case of the high voltage generating means, when the level of the self refresh signal "selfref" is enabled with a high level, the oscillating means generates a clock pulse. The clock pulse is continuously generated while the self refresh signal is enabled. When the voltage level of the clock pulse is low (i.e., on cycle), the low voltage detecting means is enabled and thus the low voltage generating means outputs the low voltage. However, when the voltage level of the clock pulse is high (i.e., off cycle), the low voltage detecting means is disabled and thus low high voltage generating means stops the pumping operation.

As described above, if the self refresh signal is enabled, the operation of the low voltage detecting means is periodically turned on or off. Therefore, the current consumption in the low voltage detecting means is stopped while the low voltage detecting means is periodically turned off. In other words, in the turned off period, the current consumption of the low voltage detector is prevented.

As illustrated above, there is a problem with the conventional on-chip voltage detecting means that operates in stand-by mode maintaing an activated state.

However, the high voltage generating device and the low voltage generating device according to the present invention have a time period during which the on-chip voltage detecting means are not activated, and thus the current consumption in the on-chip voltage detecting means in an unactivated state is prevented.

As a result, it would be possible to reduce the power consumption in the on-chip voltage detecting means where a long stand-by time is required for a self-refresh operation mode.

It is understood that various other modifications will be apparent to and can be readily made by those skilled in the art without departing from the scope and spirit of this invention. Accordingly, it is not intended that the scope of the claims appended hereto be limited to the description as set forth herein, but rather that the claims be construed as encompassing all the features of a patentable novelty that resides in the present invention, including all features that would be treated as equivalents thereof by those skilled in the art which this invention pertains.

What is claimed is:

1. An on-chip voltage generating device for a semiconductor memory comprising:
   an oscillating means for outputting a clock pulse of a certain frequency in accordance with a self refresh signal;
   a first on-chip voltage detecting means for detecting a level of an on-chip voltage during an active mode, the first on-chip voltage detecting means being controlled by a memory activating signal;
   a second on-chip voltage detecting means for detecting a level of the on-chip voltage during stand-by mode, the second on-chip voltage detecting means being controlled by the clock pulse from the oscillating means;
   a first on-chip voltage generating means for outputting the on-chip voltage in response to an output signal from the first on-chip voltage detecting means; and
   a second on-chip voltage generating means for outputting the on-chip voltage in response to an output signal from the second on-chip voltage detecting means;
   wherein the second on-chip voltage detecting means detects the level of the on-chip voltage when the self refresh signal is disabled, and is turned on/off periodically in response to the clock pulse when the self refresh signal is enabled during stand-by mode.

2. The on-chip voltage generating device for the semiconductor memory as set forth in claim 1,
   wherein the on-chip voltage is a high voltage which is applied to word lines of the semiconductor memory, and the high voltage is higher than a power supply voltage.

3. The on-chip voltage generating device for the semiconductor memory as set forth in claim 1,
   wherein the on-chip voltage is a low voltage which is applied to a bulk of the semiconductor memory, and the low voltage is lower than a ground voltage.

4. The on-chip voltage generating device for the semiconductor memory as set forth in claim 1,
   wherein the oscillating means comprises:
      first to 2N-th inverters connected in series, a NAND gate for NANDing the self refresh signal and an output signal of the 2N-th inverter, and a 2N+1-th inverter for inverting an output signal of the NAND gate and outputting the clock pulse;
      wherein the output signal from the NAND gate is applied to an input terminal of the first inverter.

5. An on-chip voltage generating device for a semiconductor memory comprising:
   an oscillator means for outputting a clock pulse of a certain frequency, the oscillator means receiving a self refresh signal, said oscillator means comprising first to 2N-th inverters connected in series, a NAND gate which receives both the self refresh signal and an output signal of the 2N-th inverter, and a 2N+1-th inverter which receives an output signal from the NAND gate, wherein the output signal from the NAND gate is applied to an input terminal of the first inverter, and operation of the high voltage detector is controlled by an output signal from the 2N+1-th inverter; and
   an on-chip voltage detecting means for detecting a level of an on-chip voltage, the on-chip voltage detecting means being controlled by the clock pulse from the oscillator; and
   on-chip voltage generating means for outputting the on-chip voltage in response to an output signal from the on-chip voltage detecting means; and
   wherein the on-chip voltage detecting means receives the on-chip voltage, performs a normal operation outputting the on-chip voltage while the self refresh signal is disabled, and is turned on/off periodically in response to the clock pulse when the semiconductor memory is entered into a stand-by mode by enabling the self refresh signal.

* * * * *